(12) United States Patent
Boescke

(10) Patent No.: US 9,299,565 B2
(45) Date of Patent: Mar. 29, 2016

(54) METHOD FOR PRODUCING A SOLAR CELL

(75) Inventor: Tim Boescke, Erfurt (DE)

(73) Assignee: SolarWorld Industries Thueringen GmbH, Arnstadt (DE)

( * ) Notice: Subject to any disclaimer, the term of this patent is extended or adjusted under 35 U.S.C. 154(b) by 0 days.

(21) Appl. No.: 14/009,006

(22) PCT Filed: Feb. 23, 2012

(86) PCT No.: PCT/EP2012/053041
§ 371 (c)(1),
(2), (4) Date: Apr. 2, 2014

(87) PCT Pub. No.: WO2012/130534
PCT Pub. Date: Oct. 4, 2012

(65) Prior Publication Data
US 2014/0206125 A1 Jul. 24, 2014

(30) Foreign Application Priority Data

Apr. 1, 2011 (DE) .......................... 10 2011 006 624

(51) Int. Cl.
*H01L 31/0224* (2006.01)
*H01L 31/18* (2006.01)
(Continued)

(52) U.S. Cl.
CPC .......... *H01L 21/2254* (2013.01); *H01L 31/061* (2013.01); *H01L 31/1804* (2013.01); *H01L 31/1864* (2013.01); *Y02E 10/547* (2013.01); *Y02P 70/521* (2015.11)

(58) Field of Classification Search
CPC ...... H01L 31/18; H01L 31/0224; H01L 21/22

USPC ......... 257/E31.001, E31.127; 438/57, 96, 97, 438/98; 136/244, 255
See application file for complete search history.

(56) References Cited

U.S. PATENT DOCUMENTS 6,429,037 B1  8/2002  Wenham et al.
2005/0003594 A1*  1/2005  Koezuka et al. .............. 438/166
(Continued)

FOREIGN PATENT DOCUMENTS

WO  WO 2007059551   5/2007
WO  WO 2011157422  12/2011

OTHER PUBLICATIONS

Mack S. et al: "Towards 19% efficient industrial perc devices using simultaneous front emitter and rear surface passivation by thermal oxidation" 35th IEEE Photovoltaic Specialists Conference (PVSC), Jun. 20-25, 2010, Honolulu, HI, USA, IEEE, Piscataway, NJ, USA, Jun. 20, 2010, pp. 34-38, XP031783873, ISBN: 978-1-4244-5890-5 abstract, p. 34 right-hand column, paragraph 2, p. 35, left-hand column, paragraph 1 p. 35, right-hand column figure 1.
(Continued)

*Primary Examiner* — Kimberly Rizkallah
*Assistant Examiner* — Brian Turner
(74) *Attorney, Agent, or Firm* — Maginot, Moore & Beck LLP

(57) ABSTRACT

In a method for producing a solar cell having a substrate made of crystalline silicon, on a surface of the Si substrate, a locally defined n-doped emitter region is produced by full-surface cold coating of the surface using a P-containing coating, followed by a local laser beam-doping of P atoms from the P-containing coating, and subsequent thermal driving in of the P atoms, starting from the doping-in region.

5 Claims, 1 Drawing Sheet

(51) Int. Cl.
  H01L 21/22    (2006.01)
  H01L 21/225   (2006.01)
  H01L 31/061   (2012.01)

(56) References Cited

U.S. PATENT DOCUMENTS

2012/0178200 A1* 7/2012 Stewart .................. 438/57
2013/0061917 A1* 3/2013 Huang .................. 136/256

OTHER PUBLICATIONS

S. Mack et al.: "Simultaneous front emitter and rear surface passivation by thermal oxidation—an industrially feasible approach to a 19% efficient perc device". $25^{nd}$ European Photovoltaic Solar Energy Conference. Proceedings of the $25^{nd}$ International Conference. WIP-Renewable Energies. Sep. 6, 2010. pp. 2218-2222. XP040531178, ISBN: 978-3-936338-26-3, abstract, p. 2218. left-hand column, paragraph 3-p. 2219, left-hand column, paragraph 1, p. 2220, left-hand column, paragraph 1 figure 1.

Mathais Weiss et al: "Selective Emitter from Structured Diffusion Source Proves its Capability of Industrial Realization", European Photovoltaic Solar Energy Conference and Exhibition (EU PVSEC), Sep. 21, 2009. pp. 1941-1944, XP002657501, ISBN: 3936338-25-6 [retrieved on Sep. 21, 2009] abstract, p. 1941, right-hand column, paragraphs 2,3, figure 1.

Roder T et al: "0.4% absolute efficiency gain of industrial solar cells by laser doped selective emitter", Jun. 7, 2009, Photovoltaic Specialists Conference (PVSC), 2009 $34^{th}$ IEEE, IEEE, Piscataway, NJ, USA, pp. 871873, XP031626438, ISBN: 978-1-4244-2949-3 pp. 871-873, cited in the application, abstract, p. 872, left-hand column, paragraph 1 figure 1.

Jeager U et al: "Selective emitter by laser doping from phosphosilicate glass", European Photovoltaic Solar Energy Conference and Exhibition (EU PVSEC), vol. 24, Sep. 1, 2009, pp. 1740-1743, XP008144094, ISBN: 3-936338-25-6, abstract, figure 1.

* cited by examiner

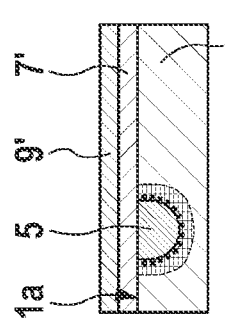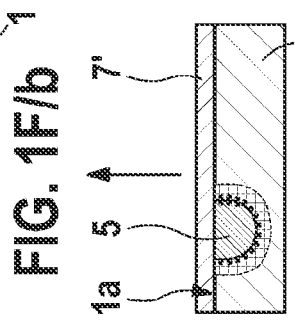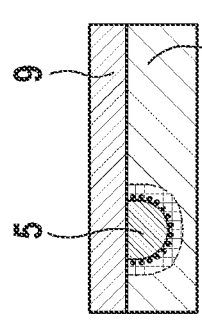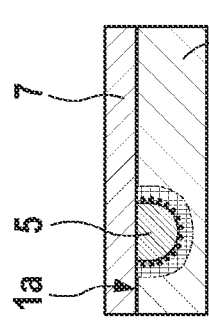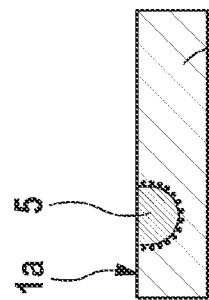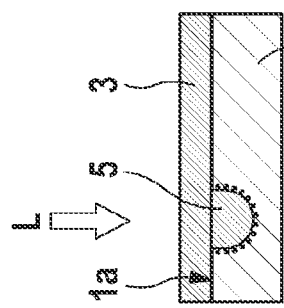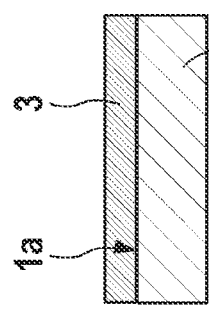

METHOD FOR PRODUCING A SOLAR CELL

CROSS REFERENCE TO RELATED APPLICATION

The present application is the national stage entry of International Patent Application No. PCT/EP2012/053041, filed on Feb. 23, 2012, which claims priority to Application No. DE 10 2011 006 624.1, filed in the Federal Republic of Germany on Apr. 1, 2011.

FIELD OF INVENTION

The present invention relates to a method for producing a solar cell having a substrate made of crystalline silicon, on one surface of the silicon substrate a locally defined, n-doped emitter region being formed by doping/driving in phosphorus (P) atoms from a P-containing coating into the substrate.

BACKGROUND INFORMATION

Within the scope of large-scale utilization of photovoltaics, which has been developing explosively in recent years, as an alternative method for generating power, solar cells based on crystalline silicon are of outstanding importance as ever. This is caused primarily by their high efficiency, but also by their proven long service life at high yield, as well as by the established and highly productive technology for producing them.

Still, competition with other methods of generating power and the dramatic reduction in politico-economic subsidies offered, forces the producers to constant cost reductions. Since the cost reduction potential is limited on the material side, there is a search for possibilities of efficiency increases in the production process of solar cells as well as subsequently situated steps of the formation of solar modules and solar panels.

In solar cells having a monocrystalline silicon substrate (especially based on CZ silicon), selectively doped emitters having a finger-like pattern have become established, which are especially formed by phosphorus doping.

In the case of the present Applicant, a process flow for producing solar cells was developed having a selective emitter according to the concept of a "patterned" source, as shown in Table 1A below. In this process flow, the wafer is first coated with phosphorus silicate glass (PSG), which is subsequently masked with a wax by inkjet pressure and is removed from the areas between the fingers in a wet-chemical manner. After removal of the wax masking, a second drive-in step takes place in an oxygen atmosphere, by which step the doping is driven deeply into the regions between the fingers and the surface concentration is reduced at the same time. Since at the time of this driving in there is no phosphorus silicate glass in these regions, a relatively pure oxide grows which may be used in an SiO/SiN stack for passivation.

By the combination of a deeply driven in emitter having good oxide passivation, very low emitter saturation currents and a good blue sensitivity are able to be achieved. One disadvantage of this method is the high cost of the inkjet masking. This is based on the material usage (wax), and the necessity for a separate wet step for the removal of the wax.

One alternative method is to apply laser doping according to T. C. Räder, P. Grabitz, S. J. Eisele, J. R. Köhler, and J. H. Werner, "0.4% Absolute Efficiency Gain of Industrial Solar Cells by Laser Doped Selective Emitter", 34th Photovoltaic Specialists Conf., edited by: IEEE Publishing Service, Piscataway, N.J. (2009), having a one-step diffusion, as shown in Table 1B below. In this instance, using a PSG coating and subsequent diffusion, first a relatively high-resistant flat diffusion is produced. Subsequently, with the aid of a laser, in the finger region the silicon is melted to a depth of a few 100 nm, whereby a greater quantity of phosphorus is able to penetrate into the substrate from the PSG present.

This method is clearly less cost-intensive than the concept, explained above, of the "patterned" source using an inkjet pressure method, since no resist is required for the patterning and there is only one high temperature step. A disadvantage is, however, that because of the one step diffusion, only a qualitatively poorer emitter is able to be produced. This is based on the fact that no deep diffusion is able to be achieved, since the surface has to remain coated with highly doped PSG. Also, the highly doped PSG cannot be used for passivating, so that the passivating has to be performed using qualitatively poorer SiN. One further problem is crystal defects in the laser-doped region, which increase the recombination in the metallized region.

The two abovementioned concepts are briefly clarified in the following tabular compilation of Tables 1A and 1B:

TABLE 1A

Patterned Source using Inkjet Method:

| | |
|---|---|
| 1 | texture |
| 2 | coating with POCl$_3$ |
| 3 | printing of finger region |
| 4 | PSG etching (HF) |
| 5 | stripping of inkjet resist |
| 6 | driving in emitter (O2) |
| 7 | oxide etching |
| 8 | PECVD nitride VS |
| 9 | printing |
| 10 | firing |

TABLE 1B

Laser Doping after Emitter Diffusion:

| | |
|---|---|
| 1 | texture |
| 2 | shallow emitter diffusion (POCl$_3$) |
| 3 | laser doping in the finger region |
| 4 | PSG etching (HF) |
| 5 | PECVD nitride VS |
| 6 | firing |

SUMMARY

An exemplary method provided according to the present invention includes a full-surface coating of the surface using a phosphorus-containing coating, using a POCl$_3$ process, for example. This is followed by a local doping in of P atoms from this coating into the Si substrate, according to a predetermined geometrical configuration of a selective emitter. This doping takes place according to an additional exemplary embodiment of the present invention, using a laser beam guided over the coating in a controlled manner. According to a further exemplary embodiment of the present invention, the driving in of the P doping into the substrate in a thermal manner is carried out. In this step, temperatures are especially about 750° C. to 1000° C.

In one exemplary embodiment of the present invention, the emitter region is locally defined by coordinate control of the laser beam relative to the substrate surface, particularly as finger patterning. It should be understood that, in this case, the laser beam, the substrate, or both are able to be moved, namely, using parameters which may be derived from the P concentration in the coating and the desired doping profile on the one hand, and the relevant parameters of the laser radiation (especially its average power) on the other hand.

The method guidance according to the present invention, in one exemplary embodiment, permits setting the P concentration in the coating (phosphorus silicate glass) relatively high, so that, because of the step of laser doping, a relatively large doping concentration is able to be achieved in a relatively short processing time.

In one further embodiment of the present invention, the step of thermal driving in of the P atoms is carried out so that, in the step of laser doping, the locally defined doping region is broadened laterally.

In a further exemplary embodiment, in the step of thermal driving in of the P atoms, a thick oxide layer (especially having a thickness of 5 nm to 100 nm) is developed on the substrate surface, and at least a part of its thickness is left there for surface passivation. In one exemplary embodiment, it is provided that a part of the thickness of the oxide layer is etched away, and a $SiN_X$ layer is deposited on the remaining thickness.

Table 1C below gives a brief representation of the relevant process steps in a similar manner to Tables 1A and 1B above.

TABLE 1C

Patterned Source having Laser Doping:

| | |
|---|---|
| 1 | texture |
| 2 | coating with phosphorus silicate glass by $POCl_3$ process |
| 3 | laser doping in the finger region |
| 4 | PSG etching (HF) |
| 5 | driving in emitter (O2) |
| 6 | oxide etching (optional) |
| 7 | PECVD nitride VS |
| 8 | printing |
| 9 | firing |

BRIEF DESCRIPTION OF THE DRAWINGS

Advantages and features of exemplary embodiments of the present invention are further described in the following with reference to the accompanying drawings.

FIGS. 1A through 1F/b show schematic cross sectional representations (detailed views) of a region close to the surface of an Si substrate in various steps of a production process of a solar cell according to an exemplary embodiment of the present invention.

DETAILED DESCRIPTION

FIG. 1A shows a process step in which, on a first surface 1a (which will later, in the employment state of the solar cell, represent its front side) of a Si solar cell substrate 1a phosphorus-containing coating (phosphorus silicate glass) 3 is situated. According to FIG. 1B, local laser radiation L acts upon phosphorus-containing coating 3, whereby a P-doping region 5 is produced, which extends from surface 1a into the depth of the substrate. After producing doping region 5, phosphorus silicate glass 3 is removed again from the entire surface 1a, whereby the state shown in FIG. 1C is formed.

Subsequently, in a thermal treatment step (symbolized by wavy arrows), preferably at about 750° C. to 1000° C., the driving of the P-doping of substrate 1 is carried out, starting from doping region 5. In this instance, a thick ("thermal") oxide $SiO_X$ grows on to the surface, which is designated here by the number 7. This thermal oxide may be completely etched away in a first exemplary variant of the further method guidance, and replaced by a $SiN_X$ layer 9 used as an antireflective layer, as shown in FIG. 1F/a. In a second exemplary variant, oxide layer 7 is only etched down, so that a planarized residual oxide layer 7' remains, as shown in FIG. 1E/b. Thereafter, a nitride layer 9' (thinner as compared to the first exemplary variant) is applied onto this residual oxide layer 7'. One additional exemplary variant (not shown) includes depositing a $SiN_X$ layer directly onto unprocessed oxide layer 7.

It should be pointed out that additional exemplary method steps of the production of a solar cell, such as the application of contact regions ("contact fingers") situated corresponding to doping regions 5 on the solar cell front side 1a using screen printing, or applying and firing a back side metallization of the solar cell back side are not shown in the figures and are not further explained in the associated description. These exemplary steps are carried out in a manner known to one skilled in the art.

Incidentally, the carrying out of the present invention is not limited to the exemplary embodiment described above, or to the aspects emphasized above of the present invention, but are also possible in a plurality of modifications, which lie within the scope of present invention.

What is claimed is:

1. A method for producing a solar cell having a substrate of crystalline silicon, comprising:
    producing on a surface of the substrate a locally defined n-doped emitter region by full surface coating of the surface using a phosphorus containing coating;
    locally laser beam-doping phosphorus atoms from the phosphorus containing coating to form locally defined doping regions in the substrate according to a predetermined geometric configuration;
    removing an entire thickness of the phosphorus containing coating down to the surface of the substrate;
    thermally driving in the phosphorus atoms of the locally defined doping regions after the phosphorus containing coating has been removed;
    during the thermally driving in of the P atoms, developing an oxide layer having a thickness in a range of 5 nm to 100 nm on the surface of the substrate; and
    etching away a part of the thickness of the oxide layer, and depositing a $SiN_X$ layer on a remaining thickness of the oxide layer.

2. The method according to claim 1, wherein the emitter region is locally defined by coordinate control of the laser beam relative to the surface of the substrate as a finger patterning.

3. The method according to claim 1, wherein the thermally driving in of the P atoms is carried out so that the doping region, locally defined during the laser beam-doping, is enlarged.

4. The method according to claim 1, further comprising:
    depositing a $SiN_X$ layer directly on an unprocessed oxide layer.

5. The method according to claim 1, further comprising:
    during the thermally driving in of the P atoms, developing an oxide layer having a thickness in a range of 5 nm to 100 nm on the surface of the substrate, subsequently completely etching away the oxide layer, and replacing the completely etched away oxide layer by a $SiN_X$ layer.

* * * * *